United States Patent
Tang et al.

(10) Patent No.: US 8,943,390 B1
(45) Date of Patent: Jan. 27, 2015

(54) PEEL DECODING FOR CONCATENATED CODES

(71) Applicant: SK hynix memory solutions inc., San Jose, CA (US)

(72) Inventors: Xiangyu Tang, San Jose, CA (US); Yu Kou, San Jose, CA (US); Lingqi Zeng, Turlock, CA (US)

(73) Assignee: SK hynix memory solutions inc., San Jose, CA (US)

( * ) Notice: Subject to any disclaimer, the term of this patent is extended or adjusted under 35 U.S.C. 154(b) by 0 days.

(21) Appl. No.: 13/676,876

(22) Filed: Nov. 14, 2012

Related U.S. Application Data (60) Provisional application No. 61/563,489, filed on Nov. 23, 2011.

(51) Int. Cl.
*H03M 13/00* (2006.01)
*H03M 13/29* (2006.01)

(52) U.S. Cl.
CPC .................................. *H03M 13/29* (2013.01)
USPC ........................... 714/776; 714/796; 714/806

(58) Field of Classification Search
CPC ............................ H04L 1/00057; H04L 1/006
USPC .................. 714/776, 797, 746, 806, 774, 786
See application file for complete search history.

(56) References Cited

U.S. PATENT DOCUMENTS

| | | | | |
|---|---|---|---|---|
| 4,295,218 | A | * | 10/1981 | Tanner .......................... 714/762 |
| 5,572,667 | A | * | 11/1996 | Ideta ................................ 714/35 |
| 8,341,502 | B2 | * | 12/2012 | Steiner et al. .................. 714/774 |
| 2008/0276156 | A1 | | 11/2008 | Gunnam et al. | 
| 2008/0301521 | A1 | | 12/2008 | Gunnam et al. |

* cited by examiner

*Primary Examiner* — Fritz Alphonse
(74) *Attorney, Agent, or Firm* — Van Pelt, Yi & James LLP (57) ABSTRACT

A codeword that is associated with one uncorrected codeword in a set of first codewords is selected from a set of third codewords. Error correction decoding is performed on the selected codeword using a third, systematic error correction code.

16 Claims, 11 Drawing Sheets

PRIOR ART

$$H_{compound} = \begin{bmatrix} H_{building\ block} & \cdots & H_{truncated} & I \end{bmatrix}$$

$\underbrace{\hspace{4cm}}_{\text{104 columns}}$ $$H_{building\ block} = \begin{bmatrix} 1 & 0 & 0 & 0 & 1 & 1 & 1 & 0 & 0 & 0 & 1 & 1 & 1 & 0 & 1 \\ 0 & 1 & 0 & 0 & 1 & 0 & 0 & 1 & 1 & 0 & 1 & 1 & 0 & 1 & 1 \\ 0 & 0 & 1 & 0 & 0 & 1 & 0 & 1 & 0 & 1 & 1 & 0 & 1 & 1 & 1 \\ 0 & 0 & 0 & 1 & 0 & 0 & 1 & 0 & 1 & 1 & 0 & 1 & 1 & 1 & 1 \end{bmatrix}$$

$\underbrace{\hspace{4cm}}_{\text{15 columns}}$

FIG. 7

PEEL DECODING FOR CONCATENATED CODES

CROSS REFERENCE TO OTHER APPLICATIONS

This application claims priority to U.S. Provisional Patent Application No. 61/563,489 entitled PEEL DECODING FOR CONCATENATED CODES filed Nov. 23, 2011 which is incorporated herein by reference for all purposes.

BACKGROUND OF THE INVENTION

Figure 1:
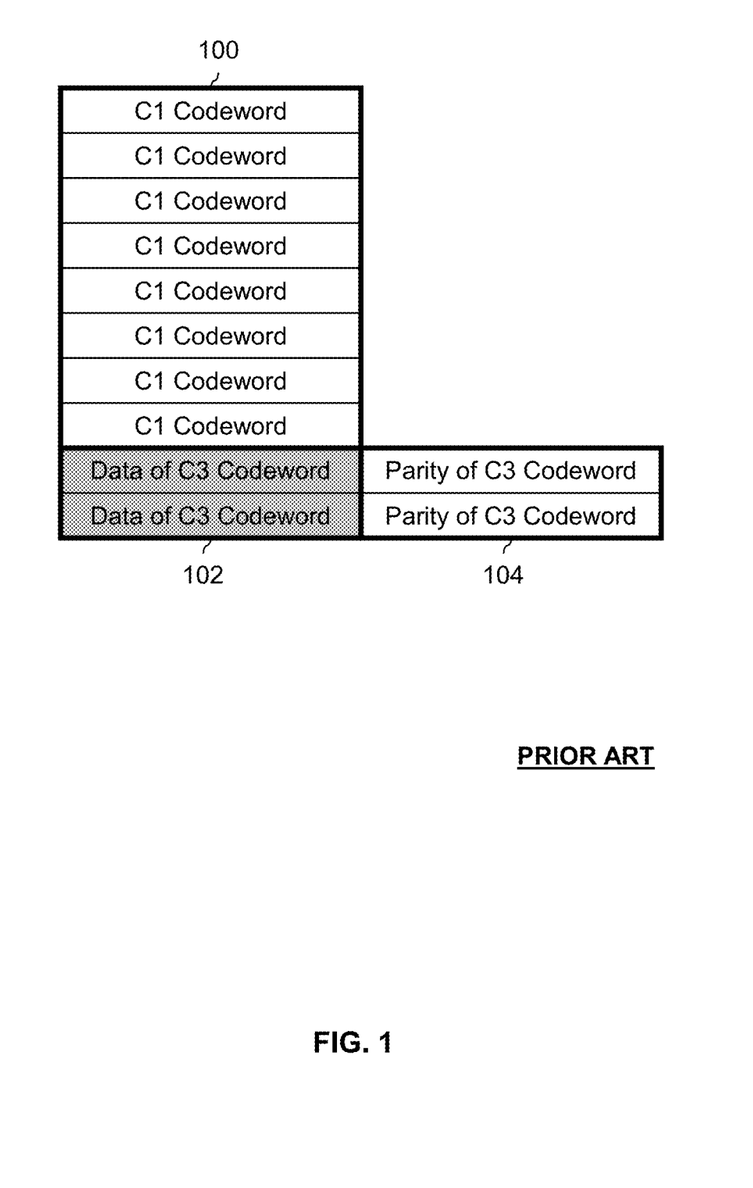
FIG. 1 is a diagram showing an example of data encoded using concatenated codes in a storage system.

FIG. 1 is a diagram showing an example of data encoded using concatenated codes in a storage system. In the example shown, a set of first codewords 100 is associated with a first error correction code (C1). Data portion 102 and parity portion 104 form a set of third codewords which is associated with a third error correction code (C3). To save space on the storage system, codewords 100 and parity portion 104 are stored, but data 102 (shaded) is not stored.

If the error correction capability of the first code (C1) fails, parity 104 is read from storage and is used in correcting those codewords from 100 that were not able to be corrected using the first code (C1). Some other decoding techniques do this by estimating or synthesizing data portion 102. However, estimating or synthesizing data portion 102 has some drawbacks. For one, estimated values for data portion 102 are typically not fed into certain read processor components, such as Viterbi decoders, because the estimates may be bad estimates which cause a Viterbi decoder to make decisions it should not. More generally, estimates may cause new errors to be introduced into the system and thus should not be fed to Viterbi decoders and other components. Another drawback is that these estimation techniques may be computationally intensive, requiring many processing cycles. New techniques for decoding concatenated codes which overcome at least some of these drawbacks would be desirable.

BRIEF DESCRIPTION OF THE DRAWINGS

Various embodiments of the invention are disclosed in the following detailed description and the accompanying drawings.

DETAILED DESCRIPTION

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

Figure 2A:
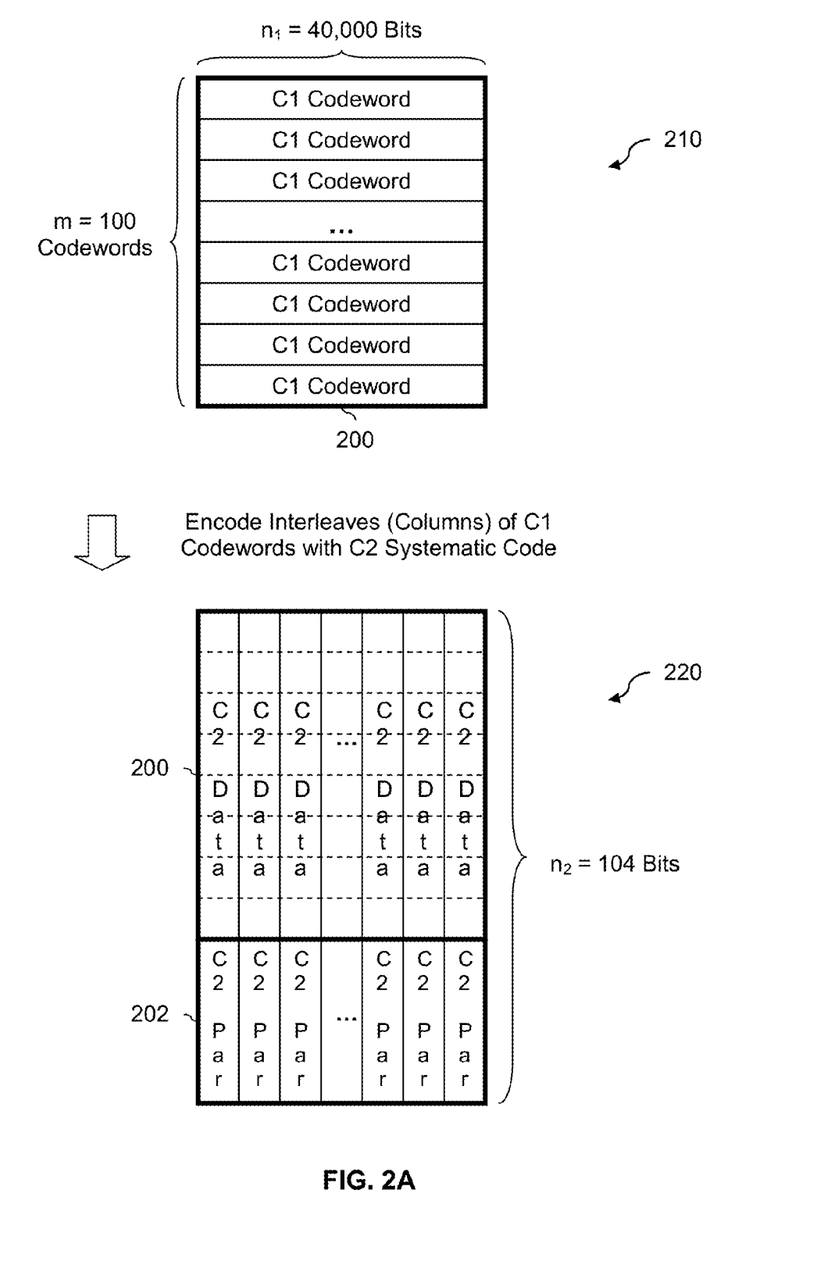
FIG. 2A is a diagram showing an embodiment of a concatenated encoding process.

FIG. 2A is a diagram showing an embodiment of a concatenated encoding process. In the example shown, a first error correction code (C1) has a code rate of $\{n_1=40,000, k_1=36,000\}$ in diagram 210. Input data which is 36,000 bits long is encoded to create codewords which are 40,000 bits long. The C1 codewords are grouped in groups of 100 codewords (i.e., m=100). It is not a requirement for the first error correction code to be a systematic code.

Interleaves of the 100 C1 codewords are encoded using a second error correction code (C2) and the output is shown in diagram 220. In the example of diagram 220, the interleaves comprise columns of the C1 codewords (which are arranged as rows). So, the first group of C2 parity information is based on some or all of the leftmost bits of the C1 codewords. The second group of C2 parity information is based on some or all of the second-from-left bits of the C1 codewords, and so on. The second code (C2) has a code rate of $\{n_2=104, k_2=100\}$ so that 4 bits of parity are generated for each of the 40,000 C2 codewords where the data portions of the C2 codewords are in region 200 and the parity portions of the C2 codewords are in region 202. The second code is a systematic code, so the C1 codewords in region 200 are not changed by the C2 encoding process and the C2 data portions of the C2 codewords are essentially the same information as the C1 codewords (except the former runs along columns and the latter runs along rows).

Figure 2B:
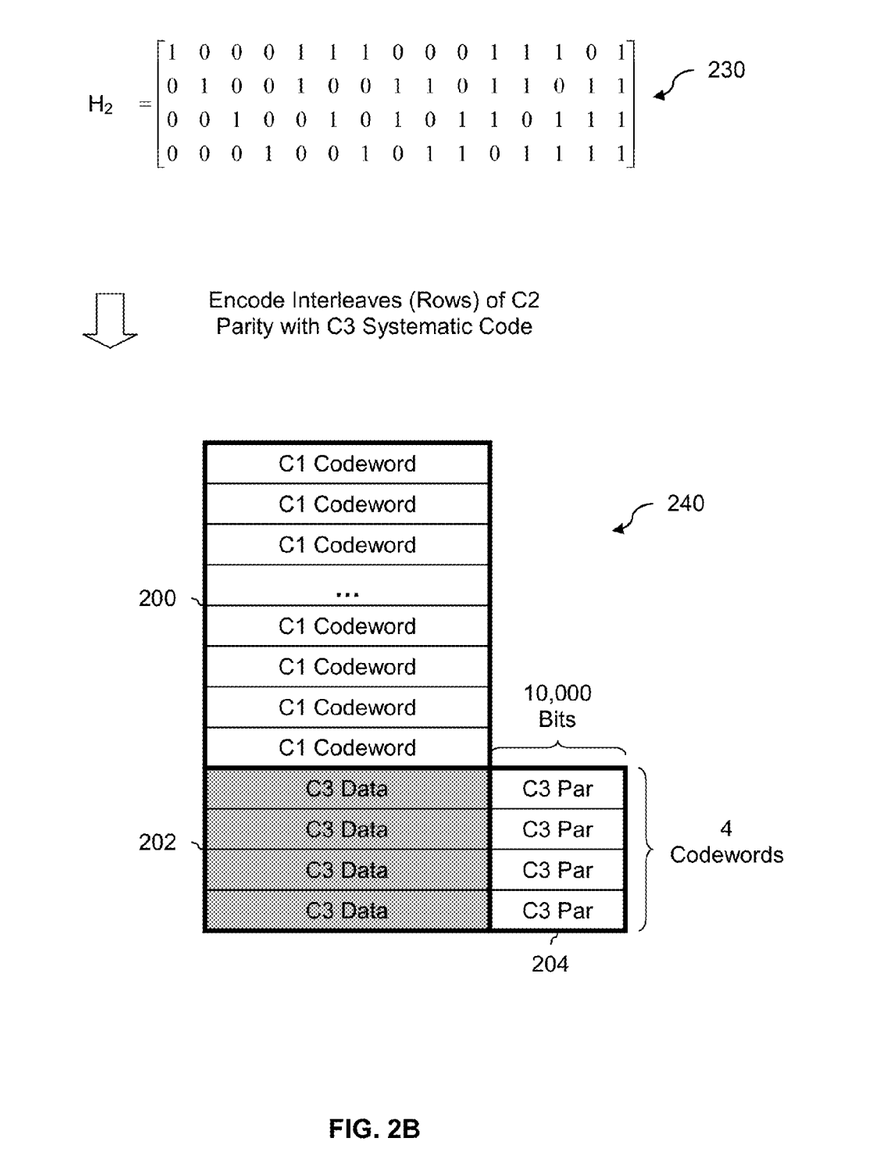
FIG. 2B is a diagram showing embodiments of a third error correction code and a parity matrix associated with a second error correction code, both of which are associated with a concatenated encoding process.

FIG. 2B is a diagram showing embodiments of a third error correction code and a parity matrix associated with a second error correction code, both of which are associated with a concatenated encoding process. FIG. 2B continues the example of FIG. 2A. Parity matrix 230 is an example of a parity matrix associated with a second error correction code, C2. For example, parity matrix 230 is used to generate the parity information in region 202 of diagram 220 in FIG. 2A.

The parity information in region 202 of diagram 220 in FIG. 2A is interleaved and encoded using a third error correction code (C3) and the output is shown in diagram 240. In some embodiments, C3 has a lower code rate than C1 which permits it to correct errors beyond the error correction capability of C1. In this example, the interleaves are rows, so that some or all of the topmost C2 parity bits are used to generate the first row of C3 parity information, some or all of the second-from-top C2 parity bits are used to generate the second row of C3 parity information, and so on. The C3 code is systematic so that the C3 data in region 202 is essentially the same information as the C2 parity in region 202. In this example, the C3 code is a $\{n_3=50,000, k_3=40,000\}$ code and so 10,000 bits of parity information are generated for each of the 4 C3 codewords. The C3 parity information occupies region 204 in diagram 240.

The information in regions 200 (e.g., the C1 codewords) and 204 (e.g., the C3 parity) is stored in storage (e.g., solid state storage, such as Flash, or magnetic storage, such as a magnetic disk drive). The information in region 202 (shaded) is not stored. The percentage of overhead information is thus $(4 \times 10,000)/(100 \times 36,000) = \sim 1\%$ which is relatively low and is thus attractive.

In some embodiments, a parity matrix associated with a second error correction code (parity matrix 230 being one example) has one or more properties selected or configured to optimize or improve peel decoding performance. In some embodiments, a parity matrix associated with a second error correction code has a certain number of columns which are linearly independent of each other. In parity matrix 230, for example, any 4 columns are linearly independent. In some embodiments, a parity matrix associated with a second error correction code has columns that include all values between 1 and w where w is the width of the parity matrix. Parity matrix 230, for example, has 15 columns and the values of the columns include all values in the range of 1 and 15, inclusive. As shown in parity matrix 230, it is not necessary for the columns to be in any particular order, such as in ascending or descending order. The values in parity matrix 230 from the leftmost column to the rightmost column are 1, 2, 4, 8, 3, 5, 9, 6, and so on.

Another way of describing this property is that C2 must be able to correct (at least) the same number of erasures as the number of sectors affected by some interference over some defined range. For example, in a shingled magnetic recording (SMR) application, inter-track interference (ITI) is a significant problem since the tracks overlap. If ITI affects at most t sectors over a range of a certain number of sectors then C2 must have an erasure correcting capability of at least t over that same range. Since any 4 columns in parity matrix 230 are linearly independent, C2 is able to correct 4 erased bits out of 15 bits. This performance of C2 is sufficient for SMR applications where groups of 4 ITI affected sectors are at most 15 sectors apart.

When some or all of the payload information associated with region 200 is desired (e.g., some or all of the 100×36,000 payload bits), the C1 codewords are accessed from storage and error correction coding is performed on the codewords using the C1 code. In most cases, the errors contained in the read-back C1 codewords are able to be corrected by the C1 code. In some cases, however, the errors exceed the error correction capability of the C1 code. In such cases, a peel decoding process may be performed. The following figures describe various embodiments of a peel decoding process.

Figure 3A:
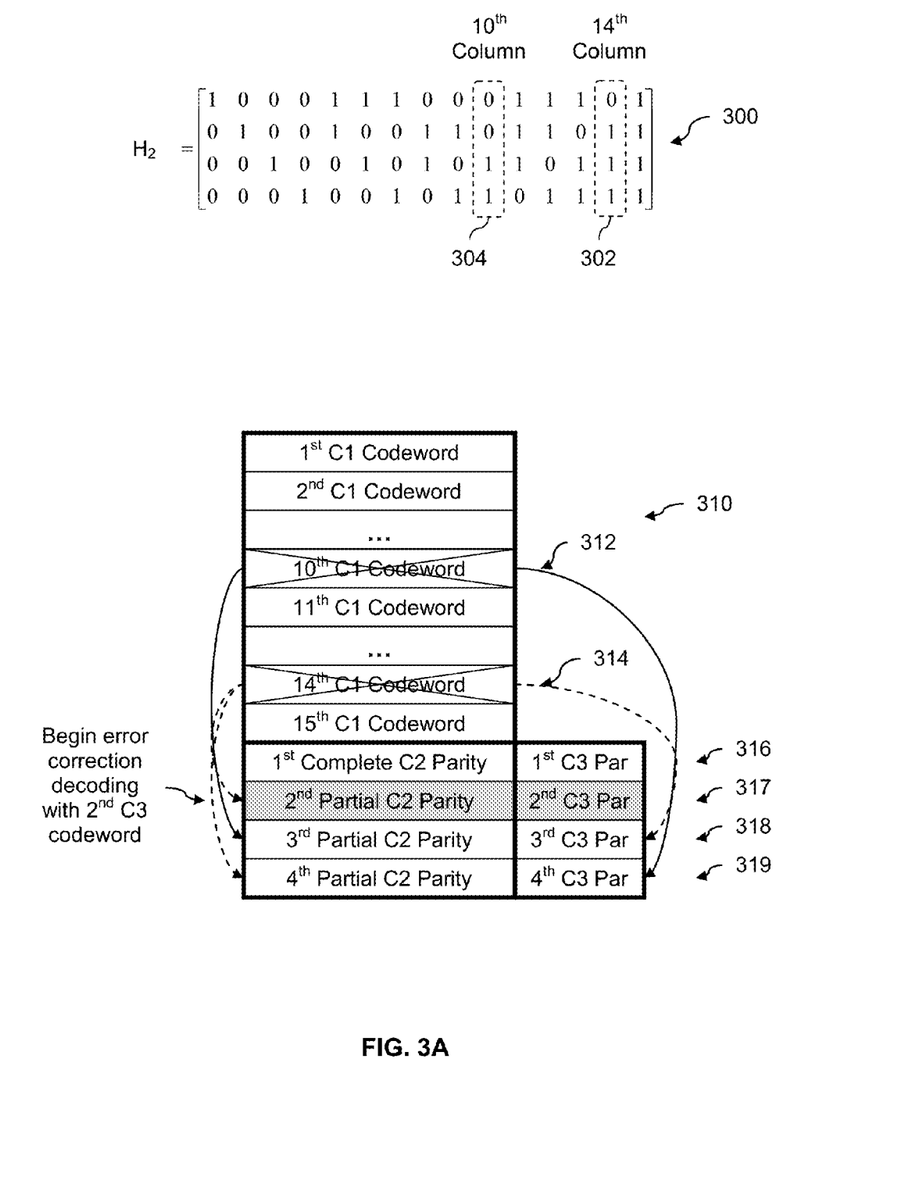
FIG. 3A is a diagram showing an embodiment of a peel decoding process, including selection of a codeword, associated with a third code, with which to begin peel decoding.

FIG. 3A is a diagram showing embodiments of a parity matrix and data associated with a peel decoding process. In the example shown, there are 15 C1 codewords in diagram 310. All of the C1 codewords have been successfully decoded, except for the $10^{th}$ C1 codeword (312) and the $14^{th}$ C1 codeword (314). Matrix 300 is the parity matrix corresponding to the second error correction code used in this example.

Column 304 in parity matrix 300 shows which of the 4 row of C2 parity bits (and thus which of the 4 C3 codewords) are affected by the $10^{th}$ C1 codeword (310). The first two elements in column 304 are 0, indicating that the $10^{th}$ C1 codeword (312) does not "feed into" the first and second rows of C2 parity bits and, thusly, neither the first C3 codeword (316) nor the second C3 codeword (317) are affected. The third and fourth elements in column 304 are 1, indicating that C1 codeword 312 "feeds into" the third C3 codeword (318) as well as the fourth C3 codeword (319) via the C2 code (i.e., C1→C2→C3). This is shown with arrows from the $10^{th}$ C1 codeword 312 to the $3^{rd}$ and $4^{th}$ C3 codewords 318 and 319.

Similarly, column 302 shows the relationship between the $14^{th}$ C1 codeword (314) and the 4 C3 codewords via the 4 rows of C2 parity bits. The first element in column 302 is a 0, so codeword 314 does not "feed into" C3 codeword 316 (e.g., via the first row of C2 parity bits), but the second, third, and fourth elements in column 302 are 1, so C1 codeword 314 does "feed into" C3 codewords 317-319 via the second, third, and fourth rows of C2 parity bits. This is shown with dashed arrows from C1 codeword 314 to C3 codewords 317-319.

An important part of peel decoding is the ordering in which the C3 codewords are decoded (e.g., after the C1 error correction decoding has failed after one or more attempts). At any iteration, the C3 codeword associated with a single uncorrected C1 codewords is selected as the C3 codeword to decode. In this example, the first C3 codeword (316) is associated with no uncorrectable C1 codewords. Selecting C3 codeword 316 to be the first C3 codeword to decode would not be useful because no corrections from the C3 code would be "fed back" to either of uncorrected C1 codewords 312 or 314. To use an analogy, there is no "bridge" between C3 codeword 316 and either of C1 codewords 312 and 314 so decoding C3 codeword would not contribute to the ultimate goal of correcting uncorrected C1 codewords 312 and 314.

The second C3 codeword (317) has 1 arrow coming into it, the third C3 codeword (318) has two arrows coming in to it, and the fourth C3 codeword (319) has two arrows coming in to it. Since the second C3 codeword (317) has one uncorrected C1 codeword associated with it, it is selected to be decoded at the first iteration.

As will be described in further detail below, the C2 parity portion and C3 data portion are not stored in storage. The C2 parity/C3 data associated with row 316 is able to be generated completely because neither of uncorrectable C1 codewords 312 or 314 is associated, and thus by definition all C1 codewords associated with row 316 were properly decoded using the C1 code. There is thus no "missing" C2 parity for row 316.

In contrast, rows 317-319 have only partial C2 parity information. Since rows 318 and 319 are associated with 2 uncorrectable C1 codewords (i.e., C1 codewords 312 and 314) they are missing more C2 parity information than row 317, which is only missing C2 parity information from uncorrectable C1 codeword 314 but not uncorrectable C1 codeword 312. As a result, selecting C3 codeword 318 or 319 to be decoded first in this peel decoding example is undesirable because, as a result of the number of uncorrectable C1 codewords (i.e., two) which feed into and/or are associated with C3 codewords 318 and 319, sufficient soft information for the C2 parity data associated with C3 codewords 318 and 319 is not available since codewords 318 and 319 have more than one C1 codeword associated with them. Although row 317 is also not associated with complete parity information, that "deficiency" is able to be overcome and is described in further detail below.

In examples described herein, during decoding, the C2 parity/C3 data comprise soft information. Soft information is represented (at least in examples described herein) using a sign and magnitude where the sign indicates a decision (e.g., positive=0 and negative=1) about an associated bit and the magnitude indicates a certainty or likelihood in that decision (e.g., a magnitude of 0 indicates an erasure or no decision whereas a maximum magnitude indicates 100% or a maximum certainty in the associated decision). One example of this type of soft information is a log-likelihood ratio (LLR). Although soft information examples are described herein, the technique is not necessarily so limited and hard information may be used to represent C2 parity/C3 data during decoding.

To generate the C2 parity (partial or complete) associated with rows 316-319, the magnitude of the soft information of the C2 parity bits is the magnitude of the soft information of the associated, uncorrected C1 codeword. In diagram 310, for example, the magnitude of the soft information for the C2 parity in row 317 is the magnitude of codeword 314. The sign of the soft information of the C2 parity bits are the multiplication of the sign of the correctly decoded C1 codeword associated with the C3 codeword. For row 317, for example, this would be the $2^{nd}$ C1 codeword, the $5^{th}$ C1 codeword, the $8^{th}$ and $9^{th}$ C1 codeword, the $11^{th}$ and $12^{th}$ C1 codeword, and the $15^{th}$ C1 codeword. See, for example the second row in matrix 300 and exclude the $10^{th}$ and $14^{th}$ columns which are associated with uncorrectable C1 codewords. This soft information can be used in soft decoders such as soft-output Viterbi decoder (SOVD), or various forms of soft ECC decoder or iterations between the SOVD and soft ECC decoder. The availability of the soft information and the resulting ability to take advantage of the soft decoders is responsible for the performance gain with this technique. If soft information is not available, such as when more than 1 C1 codeword is in error, the soft information of the C2 parity/C3 data bits need to be artificially generated. The artificially generated soft information cannot be used in SOVD and/or causes serious degradation in performance of the ECC soft decoders.

Figure 3B:
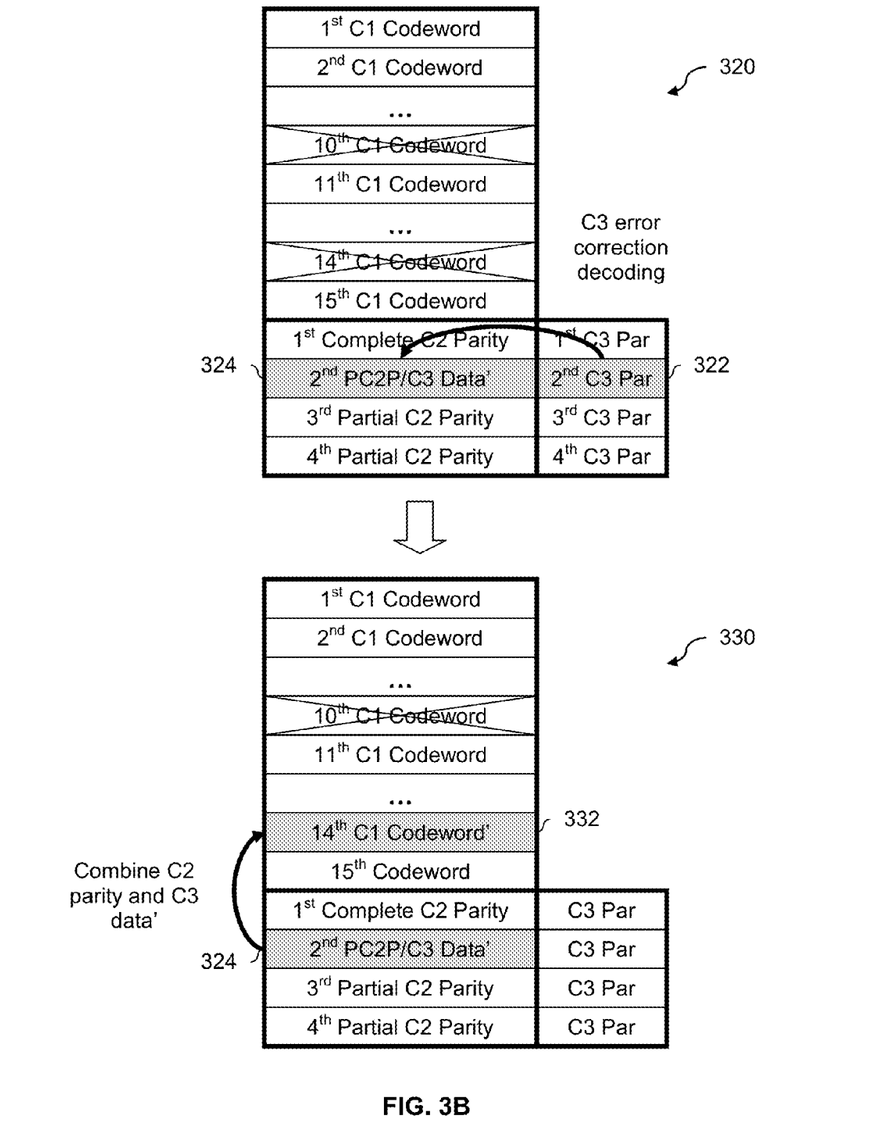
FIG. 3B is a diagram showing an embodiment of data associated with a peel decoding process at a first point in time.

FIG. 3B is a diagram showing an embodiment of data associated with a peel decoding process at a first point in time. FIG. 3B continues the example of FIG. 3A. In diagram 320, C3 parity information 322 is used to generate corrected C3 data (indicated with a ') 324 using the C3 code and the partial C2 parity for that row. In this example, the partial C2 parity 324 comprises soft information (e.g., even before C3 error correction decoding) and is generated in the manner described above.

The partial C2 parity information and the corrected C3 data (obtained from C3 error correction decoding) are combined to obtain the previously uncorrectable C1 codeword 332. For example, the information portion of the C3 decoding process (e.g., C3 data' in diagram 330, which is only available after C3 decoding completes) is multiplied by the parity encoding parity in C2 (e.g., $2^{nd}$ partial C2 parity in diagram 330, which is available before C3 decoding starts and does not change with C3 decoding). After the multiplication, decoding for C1 codeword 332 is complete and no further decoding is required for that codeword.

Figure 3C:
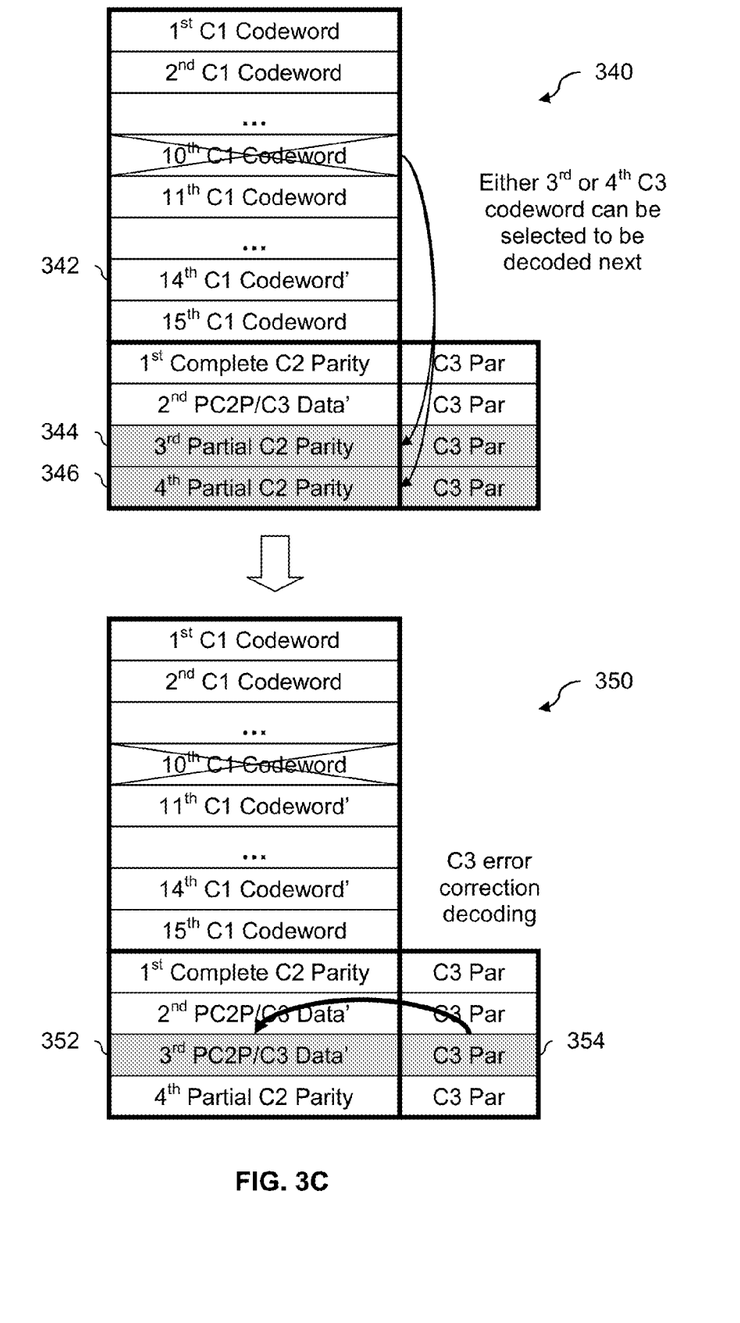
FIG. 3C is a diagram showing an embodiment of data associated with a peel decoding process at a second point in time.

FIG. 3C is a diagram showing an embodiment of data associated with a peel decoding process at a second point in time. FIG. 3C continues the example of FIG. 3B. With the $14^{th}$ C1 codeword (342) decoded, the $3^{rd}$ and $4^{th}$ C3 codewords in rows 344 and 346 are now only associated with 1 uncorrected C1 codeword. As such, either of the C3 codewords in rows 344 or 346 may be selected for C3 decoding next since we can obtain the soft information for their data portion.

In diagram 350, the $3^{rd}$ C3 codeword is selected for decoding. Using the C3 parity in 354, corrected C3 data' is generated. As before, corrected C3 data' is not available until after C3 decoding completed whereas the partial C2 parity in 352 was available before C3 decoding and does not change with C3 decoding.

Figure 3D:
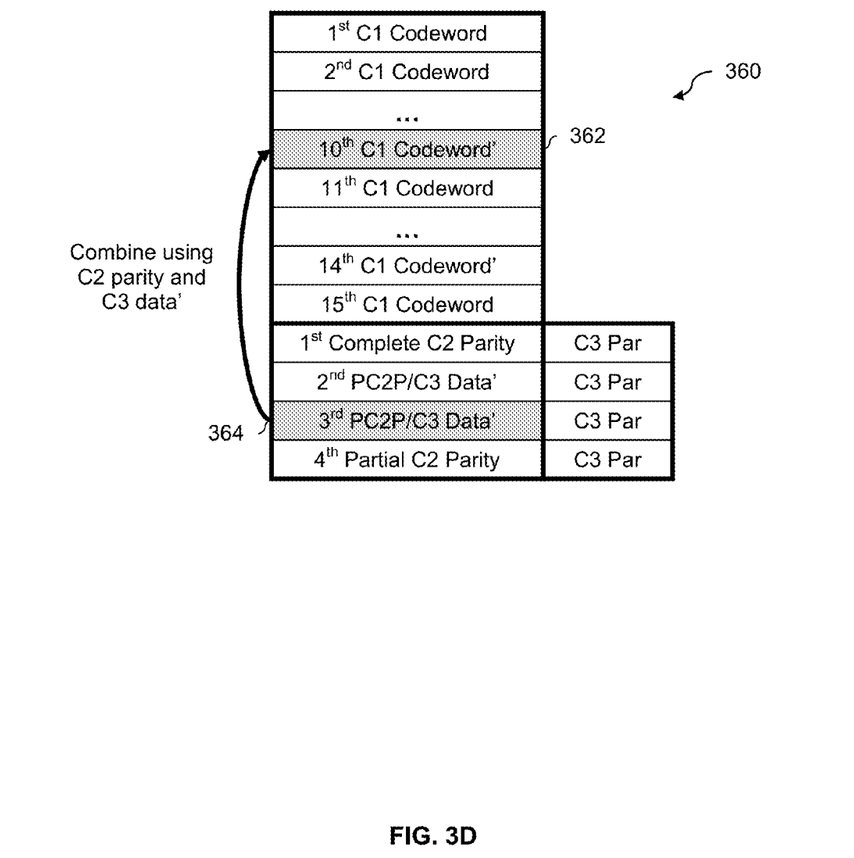
FIG. 3D is a diagram showing an embodiment of data associated with a peel decoding process at a third point in time.

FIG. 3D is a diagram showing an embodiment of data associated with a peel decoding process at a third point in time. FIG. 3D continues the example of FIG. 3C. In the example shown, the partial C2 parity in 364 is combined with the corrected C3 data' in 364. This corrects the previously uncorrected $10^{th}$ C1 codeword 362.

Figure 4:
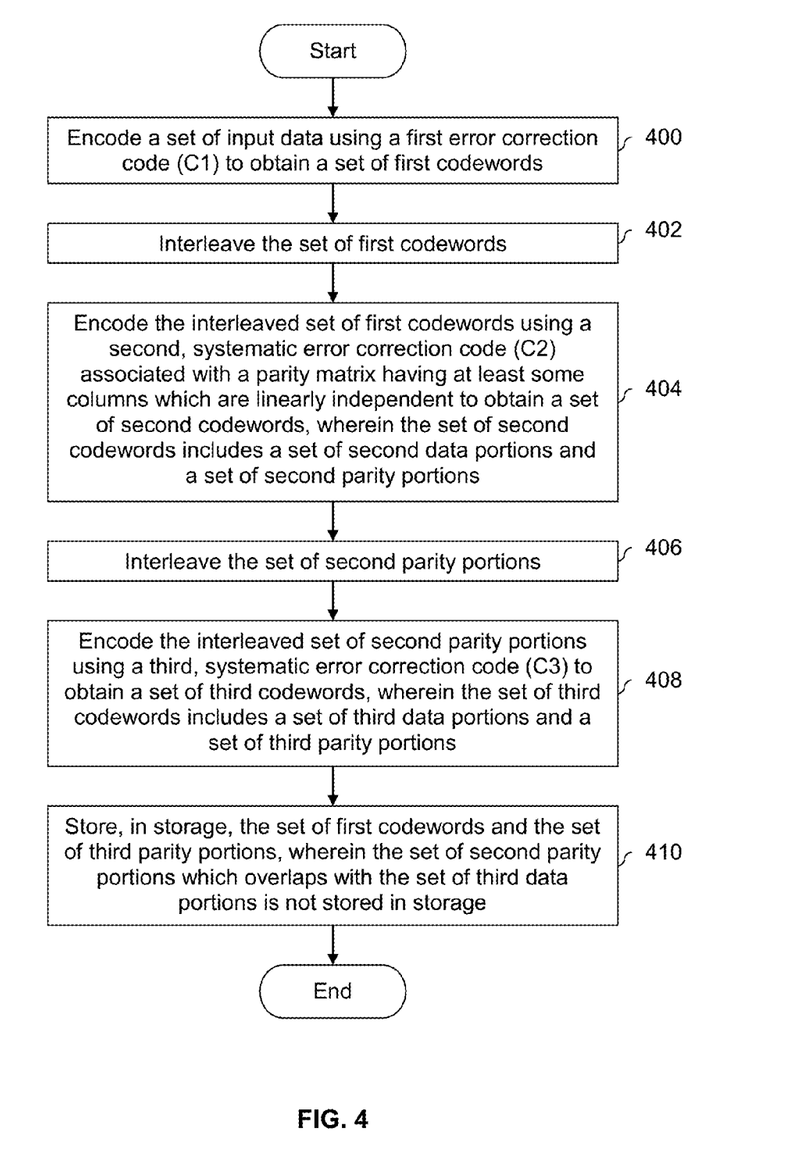
FIG. 4 is a flowchart illustrating an embodiment of a write process performed by a storage system.

FIG. 4 is a flowchart illustrating an embodiment of a write process performed by a storage system. In some embodiments, the process is performed at least in part by a semiconductor device, such as an application-specific integrated circuit (ASIC) or a field-programmable gate array (FPGA). In various embodiments, the storage system is a solid state storage system (e.g., Flash) or a magnetic storage system (e.g., a hard disk drive system).

At 400, a set of input data is encoded using a first error correction code (C1) to obtain a set of first codewords. One example is shown in diagram 210 in FIG. 2A. The set of first codewords is interleaved at 402. In FIG. 2A, for example, interleaving is performed by taking the columns of the C1 codewords (which are laid out in rows). At 404, the interleaved set of first codewords is encoded using a second, systematic error correction code (C2) associated with a parity matrix having at least some columns which are linearly independent to obtain a set of second codewords, wherein the set of second codewords includes a set of second data portions and a set of second parity portions. For example, parity matrix 230 in FIG. 2B is one example of a parity matrix where at least some columns are linearly independent. Diagram 220 in FIG. 2A shows an example of encoding an interleaved set of first codewords using a second, systematic error correction code.

At 406, the set of second parity portions is interleaved. In FIG. 2B, for example, interleaving at 406 is performed by taking the rows of the C2 parity (which are arranged in columns). The interleaved set of second parity portions is encoded using a third, systematic error correction code (C3) to obtain a set of third codewords, wherein the set of third codewords includes a set of third data portions and a set of third parity portions at 408. See, for example, diagram 240 in FIG. 2B.

At 410, the set of first codewords and the set of third parity portions are stored in storage, wherein the set of second parity portions which overlaps with the set of third data portions is not stored in storage. In diagram 240 in FIG. 2B, for example, the information in regions 200 and 204 is stored and the information in shaded region 202 is not stored.

Figure 5:
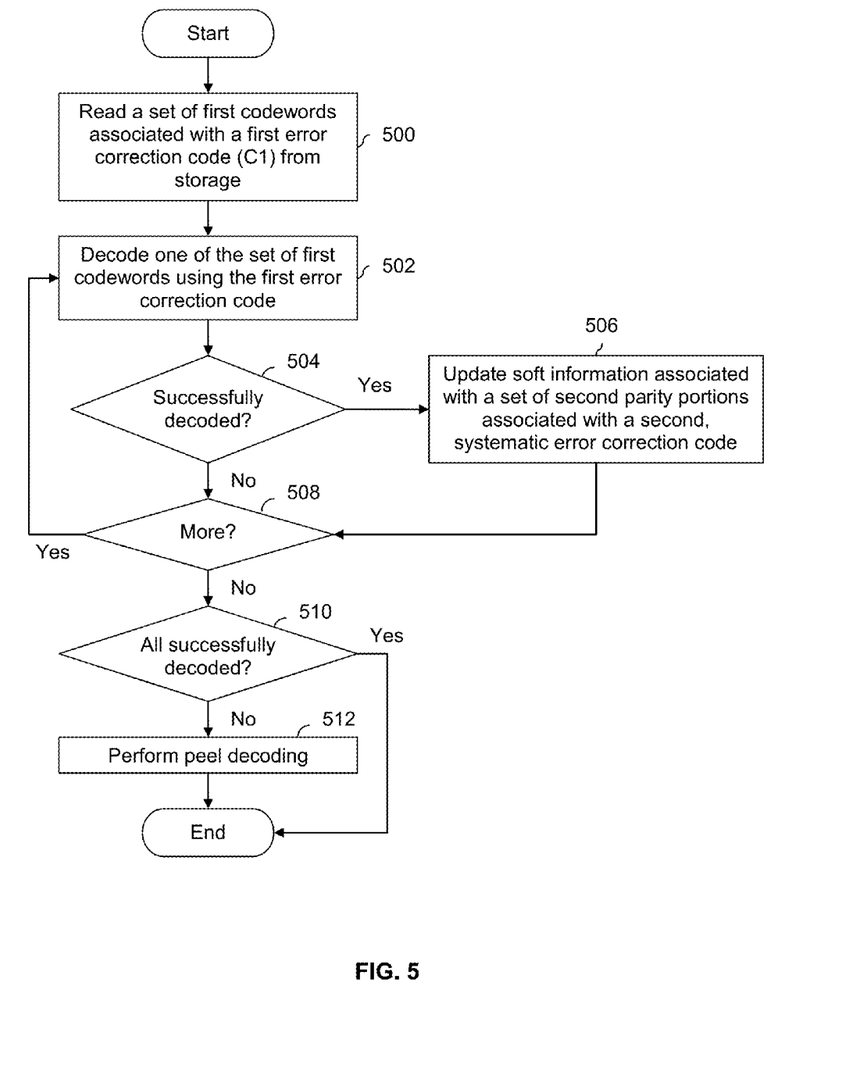
FIG. 5 is a flowchart illustrating an embodiment of a read process performed by a storage system.

FIG. 5 is a flowchart illustrating an embodiment of a read process performed by a storage system. In some embodiments, the process is performed at least in part by a semiconductor device, such as an application-specific integrated circuit (ASIC) or a field-programmable gate array (FPGA). In various embodiments, the storage system is a solid state storage system (e.g., Flash) or a magnetic storage system (e.g., a hard disk drive system).

At 500, a set of first codewords associated with a first error correction code (C1) is read from storage. For example, the C1 codewords in region 200 in FIG. 2B are read from storage. One of the set of first codewords is decoded using the first error correction code at 502. For example, the C1 codewords in region 200 in FIG. 2B may be processed from top to bottom. Any sequencing or ordering may be used. In some embodiments, initiation of decoding at 502 does not wait for all codewords to be read at 500. For example, a decoder may begin once it has enough information to do so.

At 504, it is determined if the codeword is successfully decoded. In some embodiments, decoding at 502 is performed multiple times if needed and as long as decoding is successful before some maximum number of attempts is reached, decoding is determined to be successful at 504.

If decoding is determined to be successful at 504, soft information associated with a set of second parity portions associated with a second, systematic error correction code is updated at 506. For example, the C2 parity information in shaded region 202 in FIG. 2B is not stored in storage, so step 506 generates (at least partially) that information. In some embodiments, updating a second of second parity information at 506 includes using an error correction encoder which is configured with the second code (C2) and inputting the C1 codeword (with any corrections) into the C2 encoder. In some embodiments, it is desirable to generate the partial or complete C2 parity information even if it is not used (e.g., because all C1 codewords are successfully decoded using the C1 code) because it reduces latency if peel decoding is performed. In some embodiments, updating at 506 takes relatively few processing cycles, so it is an acceptable tradeoff to perform step 506 even if the set of second parity information which is generated is not used.

If it is determined at 504 that decoding is not successful or after updating is performed at 506, it is determined at 508 if there are more codewords in the set of first codewords. In other words, unsuccessfully decoded C1 codewords are not used in generating soft information at 506. If decoding is not successful, a next codeword in the set of first codewords is decoded at 502. If there are no more codewords, it is determined at 510 if all codewords in the set of first codewords are successfully decoded. If so, the process ends. If not, peel decoding is performed at 512.

Figure 6:
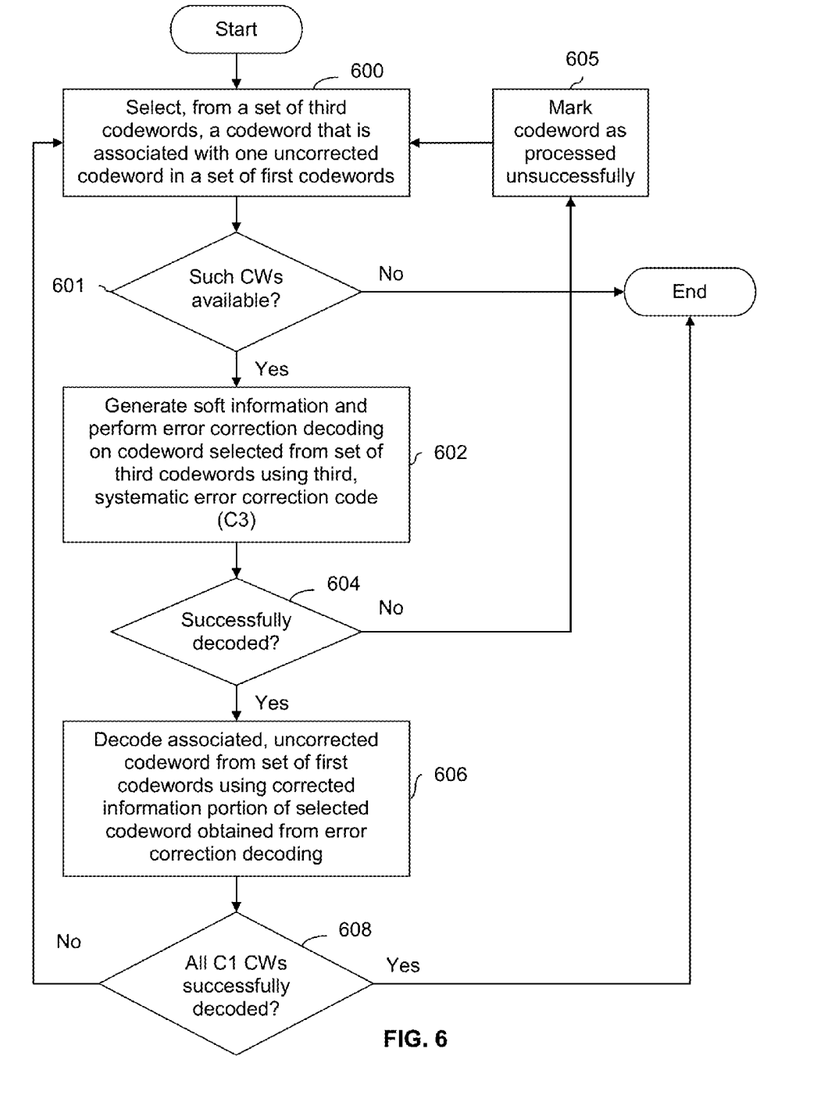
FIG. 6 is a flowchart illustrating an embodiment of a peel decoding process.

FIG. 6 is a flowchart illustrating an embodiment of a peel decoding process. In some embodiments, step 512 in FIG. 5 is performed in the following manner. At 600, a codeword that is associated with one uncorrected codeword in a set of first codewords is selected from a set of third codewords. In diagram 310 in FIG. 3A, for example, C3 codeword 317 is selected from codewords 316-319 since it only has one uncorrected C1 codeword associated with it. It is decided if such codewords are available at 601. If not, the process ends.

If such a codeword is available at 601, at 602, soft information is generated and error correction decoding is performed on a codeword selected from a set of third codewords using a third, systematic error correction code (C3). Soft information for the C3 codeword is generated by using the magnitude of the soft information of the undecoded C1 codeword, and using the sign of the result of the multiplication of the sign of its associated decoded C1 codewords. See, for example, diagram 320 in FIG. 3B.

After performing C3 decoding at 602, it is determined if decoding is successful at 604. If not, the codeword is marked as being processed unsuccessfully at 605 and another codeword is selected at 600. If decoding is successful at 604, an associated, uncorrected codeword from a set of first codewords is decoded using the corrected information portion of the selected codeword obtained from error correction decoding at 606. In diagram 324 in FIG. 3B, for example, C3 data' is combined with the $2^{nd}$ partial C2 parity (both of which are associated with region 324).

It is determined at 608 if all C1 codewords are successfully decoded. See, for example, FIG. 3D. If so, the process ends. If some uncorrected C1 codewords remain at 608 then a next codeword to decode is selected at 604. See, for example, FIG. 3C where the $14^{th}$ C1 codeword has been successfully corrected but the $10^{th}$ C1 codeword has yet to be successfully corrected.

Figure 7:
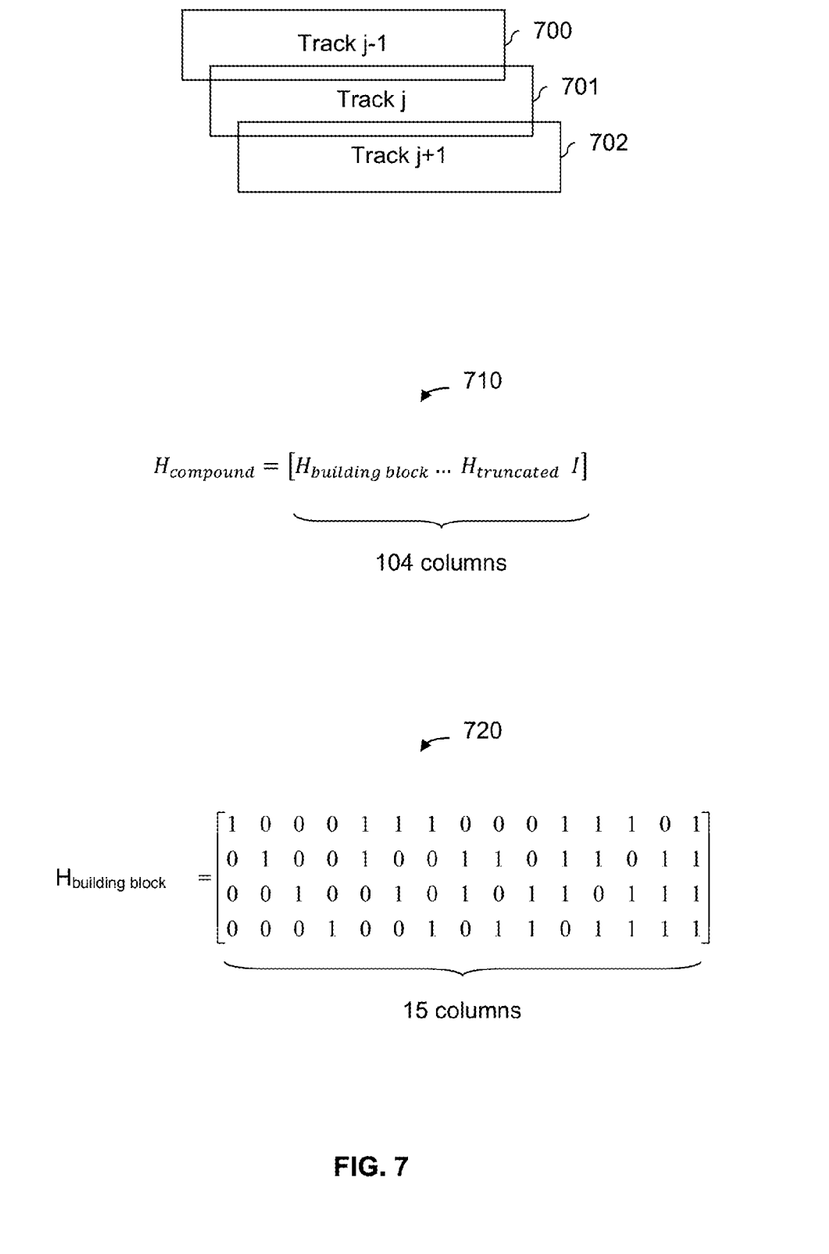
FIG. 7 is a diagram showing an embodiment of SMR tracks and an associated parity matrix.

The following figure describes an SMR system in which the technique described herein is used. Although described using SMR as an example, these peel decoding embodiments are not necessarily limited to SMR applications or systems.

FIG. 7 is a diagram showing an embodiment of SMR tracks and an associated parity matrix. In the example shown, tracks 700-702 show an example of tracks in a SMR system. In the example shown, tracks 700 and 701 overlap with each other and tracks 701 and 702 overlap with each other. In this particular example, tracks 700 and 702 do not overlap with each other (although in some other embodiments they may overlap).

Compound parity matrix 710 shows an example of a parity matrix which is constructed using building block parity matrix 720. In an exemplary SMR system, ITI affects at most affect 4 out of 100 data sectors and the 4 affected sectors are at most 15 sectors apart. As such, a C2 code only has to correct 4 erased bits over a range of 15 bits. Since building block parity matrix 720 is able to correct 4 erased bits over a range of 15 bits, building block parity matrix 720 is able to be used in constructing compound parity matrix 710. In compound parity matrix 710, building block parity matrix 720 is serially concatenated together one or more times. A truncated parity matrix ($H_{truncated}$) is used so that the width of compound parity matrix 710 comes out to 104 columns; the truncated parity matrix is building block parity matrix 720 truncated (e.g., the rightmost columns are removed). Compound parity matrix 710 ends (on the right side) with the identity matrix, I. Any four columns in compound parity matrix 720 that are within 15 columns apart are linearly independent. For SMR systems where it is assumed that 4 ITI affected sectors are at most 15 sectors apart, compound parity matrix 720 is acceptable.

Using a building block matrix to construct a compound parity matrix is attractive for a variety of reasons. Storing only a building block matrix as opposed to the much wider compound matrix reduces storage requirements. Another benefit is that parity matrices of various widths may be readily and/or easily constructed. This enables a single storage controller semiconductor device to be manufactured, but the same device can be sold to different storage companies and configured as desired (e.g., different storage systems group different numbers of codewords together, requiring parity matrices of different widths). Because of the costs associated with developing, manufacturing, and supporting multiple semiconductor devices, it is desirable to sell the same semiconductor device to multiple customers and have customers configure the devices as desired.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A method for storing data, comprising:
   using a processor to encode a set of input data using a first error correction code to obtain a set of first codewords;
   interleaving the set of first codewords;
   using the processor to encode the interleaved set of first codewords using a second, systematic error correction code associated with a parity matrix having at least some columns which are linearly independent to obtain a set of second codewords, wherein the set of second codewords includes a set of second data portions and a set of second parity portions;
   interleaving the set of second parity portions;
   using the processor to encode the interleaved set of second parity portions using a third, systematic error correction code to obtain a set of third codewords, wherein the set of third codewords includes a set of third data portions and a set of third parity portions; and
   storing, in storage, the set of first codewords and the set of third parity portions, wherein the set of second parity portions which overlaps with the set of third data portions is not stored in storage.

2. The method recited in claim 1, wherein the method is performed at least in part by a semiconductor device, including one or more of the following: an application-specific integrated circuit (ASIC) or a field-programmable gate array (FPGA).

3. The method recited in claim 1, wherein the parity matrix has a width of w and the values of the columns includes all values in the range of 1 and w, inclusive.

4. The method recited in claim 1, wherein the parity matrix includes at least one full copy of a building block parity matrix, at least one partial copy of the building block parity matrix, and at least one copy of an identity matrix.

5. A system for storing data, comprising:
   a processor; and
   a memory coupled with the processor, wherein the memory is configured to provide the processor with instructions which when executed cause the processor to:
      encode a set of input data using a first error correction code to obtain a set of first codewords;
      interleave the set of first codewords;
      encode the interleaved set of first codewords using a second, systematic error correction code associated with a parity matrix having at least some columns which are linearly independent to obtain a set of second codewords, wherein the set of second codewords includes a set of second data portions and a set of second parity portions;
      interleave the set of second parity portions;
      encode the interleaved set of second parity portions using a third, systematic error correction code to obtain a set of third codewords, wherein the set of third codewords includes a set of third data portions and a set of third parity portions; and
      store, in storage, the set of first codewords and the set of third parity portions, wherein the set of second parity portions which overlaps with the set of third data portions is not stored in storage.

6. The system recited in claim 5, wherein the system includes a semiconductor device, including one or more of the following: an application-specific integrated circuit (ASIC) or a field-programmable gate array (FPGA).

7. The system recited in claim 5, wherein the parity matrix has a width of w and the values of the columns includes all values in the range of 1 and w, inclusive.

8. The system recited in claim 5, wherein the parity matrix includes at least one full copy of a building block parity matrix, at least one partial copy of the building block parity matrix, and at least one copy of an identity matrix.

9. A computer program product for storing data, the computer program product being embodied in a non-transitory computer readable storage medium and comprising computer instructions for:
   encoding a set of input data using a first error correction code to obtain a set of first codewords;
   interleaving the set of first codewords;
   encoding the interleaved set of first codewords using a second, systematic error correction code associated with a parity matrix having at least some columns which are linearly independent to obtain a set of second codewords, wherein the set of second codewords includes a set of second data portions and a set of second parity portions;
   interleaving the set of second parity portions;
   encoding the interleaved set of second parity portions using a third, systematic error correction code to obtain a set of third codewords, wherein the set of third codewords includes a set of third data portions and a set of third parity portions; and
   storing, in storage, the set of first codewords and the set of third parity portions, wherein the set of second parity portions which overlaps with the set of third data portions is not stored in storage.

10. The computer program product recited in claim 9, wherein the computer program product is configured to be utilized at least in part by a semiconductor device, including one or more of the following: an application-specific integrated circuit (ASIC) or a field-programmable gate array (FPGA).

11. The computer program product recited in claim 9, wherein the parity matrix has a width of w and the values of the columns includes all values in the range of 1 and w, inclusive.

12. The computer program product recited in claim 9, wherein the parity matrix includes at least one full copy of a building block parity matrix, at least one partial copy of the building block parity matrix, and at least one copy of an identity matrix.

13. A system for storing data, comprising:
   means for encoding a set of input data using a first error correction code to obtain a set of first codewords;
   means for interleaving the set of first codewords;
   means for encoding the interleaved set of first codewords using a second, systematic error correction code associated with a parity matrix having at least some columns which are linearly independent to obtain a set of second codewords, wherein the set of second codewords includes a set of second data portions and a set of second parity portions;
   means for interleaving the set of second parity portions;
   means for encoding the interleaved set of second parity portions using a third, systematic error correction code to obtain a set of third codewords, wherein the set of third codewords includes a set of third data portions and a set of third parity portions; and
   means for storing the set of first codewords and the set of third parity portions, wherein the set of second parity portions which overlaps with the set of third data portions is not stored in storage.

14. The system recited in claim 13, wherein the system includes a semiconductor device, including one or more of the following: an application-specific integrated circuit (ASIC) or a field-programmable gate array (FPGA).

15. The system recited in claim 13, wherein the parity matrix has a width of w and the values of the columns includes all values in the range of 1 and w, inclusive.

16. The system recited in claim 13, wherein the parity matrix includes at least one full copy of a building block parity matrix, at least one partial copy of the building block parity matrix, and at least one copy of an identity matrix.

* * * * *